United States Patent [19]
Fried et al.

[11] Patent Number: 5,592,129
[45] Date of Patent: Jan. 7, 1997

[54] HIGH RESOLUTION, LARGE MULTIPLICATION FACTOR DIGITALLY-CONTROLLED FREQUENCY MULTIPLIER

[75] Inventors: Rafael Fried, Caesarea; Eyal Rozin, Ramat-Gan, both of Israel

[73] Assignee: National Semiconductor Corporation, Santa Clara, Calif.

[21] Appl. No.: 494,575

[22] Filed: Jun. 22, 1995

[51] Int. Cl.[6] .................. H03B 5/24; H03L 7/18
[52] U.S. Cl. .................. 331/111; 331/1 A; 331/16; 331/25; 331/34; 331/143; 331/179; 327/42; 327/43; 327/107; 327/155; 327/160; 455/260
[58] Field of Search .................. 331/1 A, 16, 18, 331/25, 34, 57, 111, 143, 175; 327/39, 40, 42, 43, 105, 107, 160, 162, 155; 455/260

[56] References Cited

U.S. PATENT DOCUMENTS

| | | | |
|---|---|---|---|
| 3,681,706 | 8/1972 | Harzer | 331/1 A |
| 4,103,251 | 7/1978 | Glick | 331/1 A |
| 4,446,446 | 5/1984 | Fowks | 331/3 |
| 4,533,880 | 8/1985 | Geurts | 331/1 A |
| 4,639,692 | 1/1987 | Kitaguchi | 331/143 X |
| 4,670,718 | 6/1987 | Geurts | 331/1 A X |
| 4,723,114 | 2/1988 | D'Arrigo et al. | 331/143 X |
| 4,742,315 | 5/1988 | Schreilechner | 331/143 X |
| 4,888,564 | 12/1989 | Ishigaki | 331/1 A |
| 4,906,944 | 3/1990 | Frerking | 331/1 A |
| 5,182,528 | 1/1993 | Zuta | 331/34 X |
| 5,257,294 | 12/1993 | Pinto et al. | 375/120 |
| 5,315,270 | 5/1994 | Leonowich | 331/1 A |
| 5,416,446 | 5/1995 | Holler, Jr. et al. | 331/34 X |
| 5,459,437 | 10/1995 | Campbell | 331/34 X |

*Primary Examiner*—David Mis
*Attorney, Agent, or Firm*—Skjerven, Morrill, MacPherson, Franklin & Friel

[57] ABSTRACT

A frequency multiplier circuit generates an supplemental high-frequency timing signal from a single, low-frequency current-controlled oscillator (CCO). The current-controlled oscillator (CCO) generates a controlled discharge current and a controlled bias current which are controlled in parallel to substantially eliminate inaccuracies in a characteristic frequency-current curve of the current-controlled oscillator. The frequency multiplier circuit generates a high-frequency timing signal using the digitally-controlled CCO and avoids the usage of a phase-locked loop (PLL) technique. Specifically, a frequency multiplier includes a current-controlled oscillator having a plurality of input lines connected to receive a digital current select signal and having an output terminal connected to carry a timing signal at a current-controlled oscillator frequency $f_{CCO}$ set in accordance with the current select signal. The frequency multiplier further includes a control circuit having a first timing input terminal connected to the current-controlled oscillator output terminal to receive the current-controlled oscillator frequency $f_{CCO}$, output lines connected to the current-controlled oscillator digital current select input lines, a second timing input terminal connected to receive a timing signal at a reference frequency $f_{REF}$, and a plurality of input lines connected to receive a programmable frequency multiplication factor.

32 Claims, 8 Drawing Sheets

HIGH RESOLUTION, LARGE MULTIPLICATION FACTOR DIGITALLY-CONTROLLED FREQUENCY MULTIPLIER

FIELD OF INVENTION

The present invention relates to frequency multiplier circuits. Specifically, the invention relates to a frequency multiplier circuit that multiples frequency at a high multiplication factor.

BACKGROUND OF THE INVENTION

Various integrated circuit chips are timed using two separate clock systems, one a low-frequency system and the second a high frequency system. Typically, two oscillators are incorporated into these systems to supply the dual timing rates. Since oscillators consume power and space, it is generally advantageous to eliminate one of the oscillators and generate two timing signals from a single oscillator.

Two techniques are used to generate two timing signals from a single oscillator. One technique involves usage of a high-frequency oscillator. A low-frequency timing signal is formed using a frequency divider to divide the high-frequency timing signal. Unfortunately, in circuit operating modes which utilize only low-frequency timing signals, a high-frequency oscillator is very wasteful of power. Generally a special high-frequency oscillator is needed to limit power consumption to a reasonable level.

A second technique for generating two timing signals from a single oscillator is to utilize only a low-frequency oscillator. A high-frequency timing signal is formed by incorporating a frequency multiplier to multiply the low-frequency signal. Typically most implementations of a frequency multiplier include a phase-locked loop (PLL) circuit. However, a PLL implementation generally requires special circuit techniques such as charge pump circuits to achieve a high multiplication factor. Another disadvantage of PLL implementations is a long delay incurred during frequency locking. Furthermore, PLL implementations are potentially unstable circuits. PLL circuits unacceptably consume a large area of an integrated circuit. In addition, PLL implementations have great difficulty in achieving large multiplication factors. A potential advantage of a phase-locked loop implementation is that the phase between the high and low-frequency timing signals is correlated. However, this advantage is rarely exploited in a frequency multiplier circuit.

SUMMARY OF THE INVENTION

In accordance with the present invention, a frequency multiplier circuit generates an supplemental high-frequency timing signal from a single, low-frequency oscillator. The frequency multiplier circuit generates a high-frequency timing signal using a digitally-controlled current controlled oscillator (CCO) and avoids the usage of a phase-locked loop (PLL) technique.

In accordance with one embodiment of the present invention, a frequency multiplier includes a current-controlled oscillator having a plurality of input lines connected to receive a digital current select signal and having an output terminal connected to carry a timing signal at a current-controlled oscillator frequency $f_{CCO}$ set in accordance with the current select signal. The frequency multiplier further includes a control circuit having a first timing input terminal connected to the current-controlled oscillator output terminal to receive the current-controlled oscillator frequency $f_{CCO}$, output lines connected to the current-controlled oscillator digital current select input lines, a second timing input terminal connected to receive a timing signal at a reference frequency $f_{REF}$, and a plurality of input lines connected to receive a programmable frequency multiplication factor.

Many advantages are attained by the frequency multiplier circuit disclosed herein. One advantage is that the frequency of the high-frequency timing signal is controlled directly and digitally in discrete steps. In contrast, a conventional frequency multiplier including a PLL regulates frequency by sensing phase so that a high resolution analog sensing circuit must be used. Frequency and phase errors are corrected based on the phase lead and phase lag sensed by the analog sensing circuit. In the frequency multiplier circuit in accordance with the present invention, a phase measurement is unnecessary, and thus advantageously omitted, and frequency correction is achieved by directly setting the frequency using a digital control signal.

The disclosed frequency multiplier advantageously responds to a programmed request for a step change in frequency in one clock cycle—virtually instantly. In comparison, conventional frequency multipliers, particularly frequency multipliers utilizing a phase-locked loop, respond slowly with a frequency change lasting several cycles, typically hundreds of cycles. As a result of this quick response, the disclosed frequency multiplier changes the frequency smoothly and continuously while conventional frequency multipliers do not change frequency smoothly.

Further advantages are that the disclosed frequency multiplier has near zero jitter, a high dynamic range, immediate recovery following power-save mode of operation and offset bias control to improve frequency resolution. Another advantage of the frequency multiplier circuit is its simplicity, small area and very low sensitivity to process variations and supply voltage.

It is advantageous that the current-controlled oscillator is controlled digitally and that a digital value relating the slow clock and fast clock are saved during operation. Thus recovering from a power-save mode to a regular operating mode is immediate. Specifically, initialization and stabilization of system timing is immediate.

BRIEF DESCRIPTION OF THE DRAWINGS

The features of the invention believed to be novel are specifically set forth in the appended claims. However, the invention itself, both as to its structure and method of operation, may best be understood by referring to the following description and accompanying drawings.

DETAILED DESCRIPTION

Figure 1:
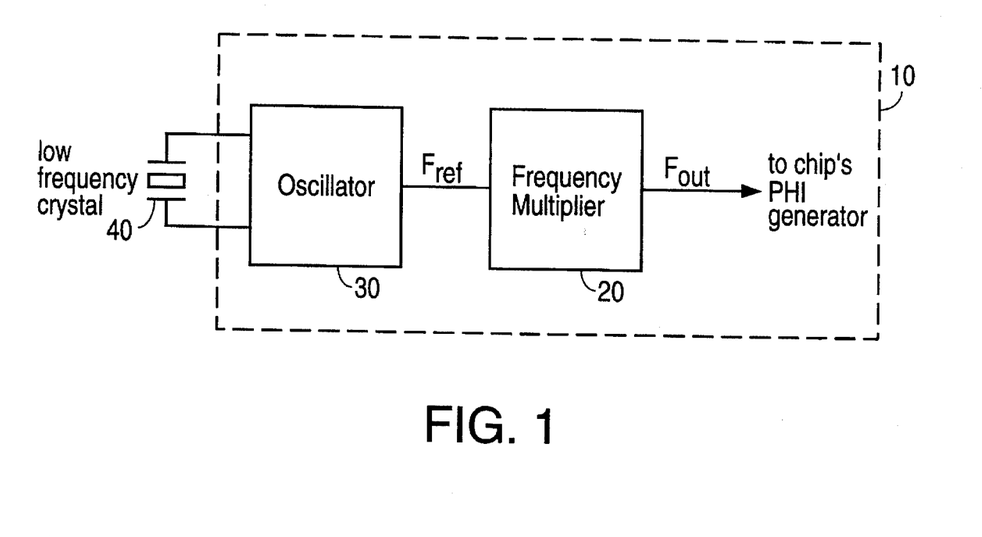
FIG. 1 is a schematic block diagram illustrating an environment in which a frequency multiplier in accordance with the present invention is employed.

FIG. 1 illustrates an environment 10 in which a frequency multiplier 20 is employed. In particular, the frequency multiplier 20 receives a reference frequency clock signal on a reference clock line $f_{REF}$ and generates a multiplied frequency on a high-frequency line $f_{OUT}$. The frequency of the multiplied timing signal is typically much higher than the reference frequency, which is generated by a low frequency oscillator 30, driven by a low frequency crystal 40. For example, in one embodiment the oscillator generates a real time clock signal at 32,768 Hz for a power-save mode of operation and the frequency multiplier generates a supplemental high-frequency timing signal, in the range of 40 MHz, for regular operation.

Figure 2:
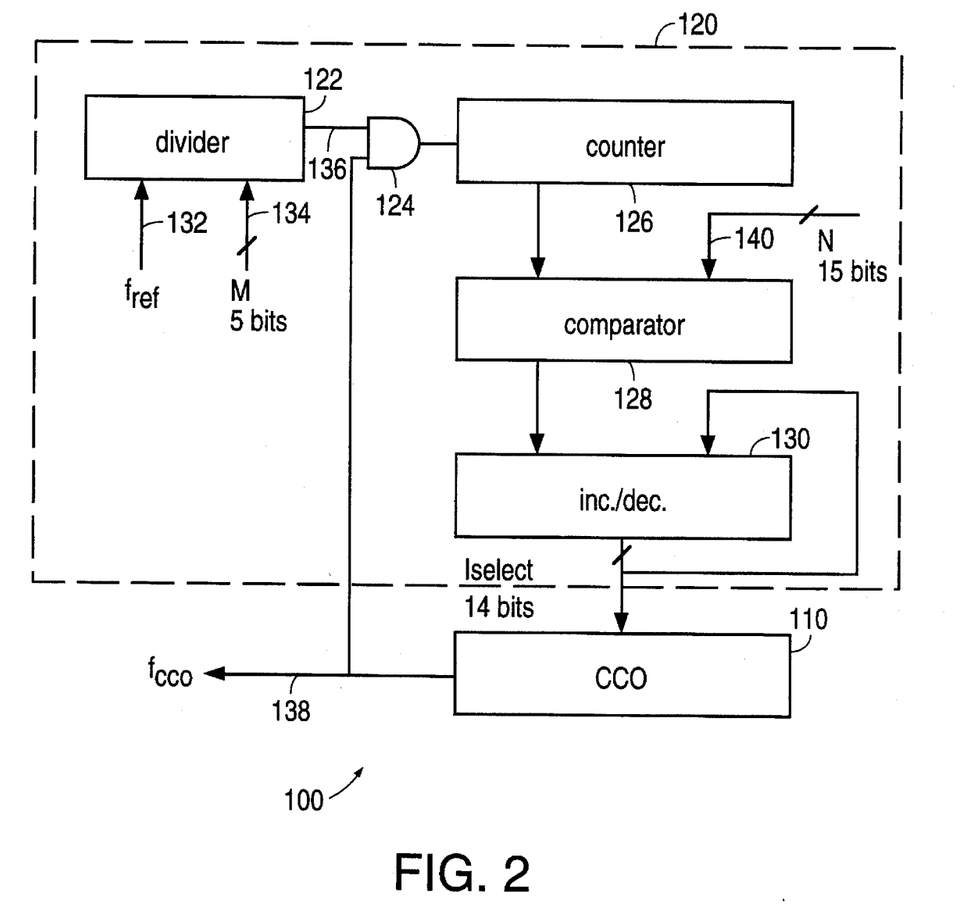
FIG. 2 is a schematic block diagram showing a frequency multiplier in accordance with an embodiment of the present invention.

Referring to FIG. 2, a frequency multiplier circuit 100 includes a current-controlled oscillator (CCO) 110 and a CCO control circuit 120. The CCO control circuit 120 includes a divider 122, an AND gate 124, a counter 126, a comparator 128, and an increment/decrement circuit 130.

The divider 122 has a timing input terminal connected to a reference frequency clock line 132 from a system oscillator (not shown), the low-frequency oscillator of a system. The divider 122 also is connected to a plurality of digital input lines M 134 which supply bits of a cycle count control code M. The cycle count control code M designates the number of cycles of the low-frequency timing signal on the reference frequency clock line 132 that make up a time frame. The divider 122 is connected to a time frame output line 136. The divider 122 is a frequency divider which divides the frequency of timing pulses at the reference frequency by the cycle count control code M to yield a series of pulses at a time frame frequency on the time frame output line 136.

Time frame output line 136 and a current-controlled oscillator (CCO) frequency clock line 138 are connected to two input terminals of AND gate 124. Accordingly, the pulses at the time frame frequency serve as an enable signal to the AND gate 124, enabling the CCO frequency pulses on the CCO frequency clock line 138. An output terminal of the AND gate 124 is connected to the counter 126, which counts the number of enabled CCO frequency pulses. The counter 126 has a plurality of output terminals which are connected to the comparator 128. The comparator 128 also is connected to a plurality of digital input lines N 140 which supply bits of a frequency multiplier count control code N. The frequency multiplier count control codes N and M determine the frequency multiplication factor by which the low-frequency oscillator signal is multiplied to generate the high-frequency timing signal. The comparator 128 compares the number of enabled CCO frequency pulses with the frequency multiplier count control code and generates a binary logic signal which is applied on a line connected to the increment/decrement circuit 130. The increment/decrement circuit 130 increments and decrements a digital current select signal $I_{select}$, for example a 14-bit signal in accordance with the binary logic signal from the comparator 128. In particular, the increment/decrement circuit 130 increments the current select signal $I_{select}$ if the number of enabled CCO frequency pulses is less than the frequency multiplier count control code. Otherwise, the current select signal $I_{select}$ is decremented.

The current select signal $I_{select}$ is communicated from the increment/decrement circuit 130 to the CCO 110 which generates CCO frequency timing signals on the CCO frequency clock line 138. The CCO 110 includes a plurality of current sources (not shown) to achieve high resolution in a frequency multiplier 100 having a high frequency multiplication factor. The operation of the CCO 110 is analogous to the operation of a digital to analog converter (DAC). However, the CCO 110 is not restricted to linearity or monotonicity specifications that are commonly imposed on DAC circuits.

In one embodiment, a CCO 110 has 14 binary-weighted current sources, in which the current source weighting utilizes the standard binary weights of 1, 2, 4, 8 . . . multiplication factors. In this embodiment, CCO 110 operates in a manner similar to that of a 14-bit DAC. Using standard binary weighting, a unit change in the current select signal $I_{select}$ results in a unit change in oscillation frequency.

In alternative embodiments, a current-controlled oscillator utilizes other weighting multiplication factors. For example, one alternative embodiment sets overlapping weights in the mirroring transistors. The term "overlapping" designates that standard binary weighting is not used and, instead, a weighting is used in which a unit change in the current select signal $I_{select}$ causes a change in frequency that is less than a unit change. For example, rather than using a binary weighting of 1, 2, 4, 8 . . . , a overlapping weighting is used such as 1, 1.9, 3.6, 7.4, . . . , etc. As a result, a single bit change in the current select signal $I_{select}$, for example from 0111 (7) to 1000 (8) changes oscillation frequency from 6.5 (the result of addition of 1+1.9+3.6) to 7.4, a change of less than one unit step.

The frequency multiplier circuit 100 is a high resolution frequency multiplier which multiplies frequency with a high multiplication factor. For example, in one embodiment a low-frequency real time clock generates timing signals at a 32 kHz rate. The low-frequency rate is typically used for a power save mode of operation. The frequency multiplier circuit 100 multiplies the low frequency timing signal to generate a high-frequency timing signal at, for example, 40 MHz. The high-frequency rate is typically used for a regular operating mode. Usage of the frequency multiplier circuit 100 eliminates usage of an additional high-frequency oscillator, thereby avoiding high current consumption inherent in conventional high-frequency oscillators. Accordingly, an integrated circuit chip is driven by a single, low-frequency timing source.

Figure 3:
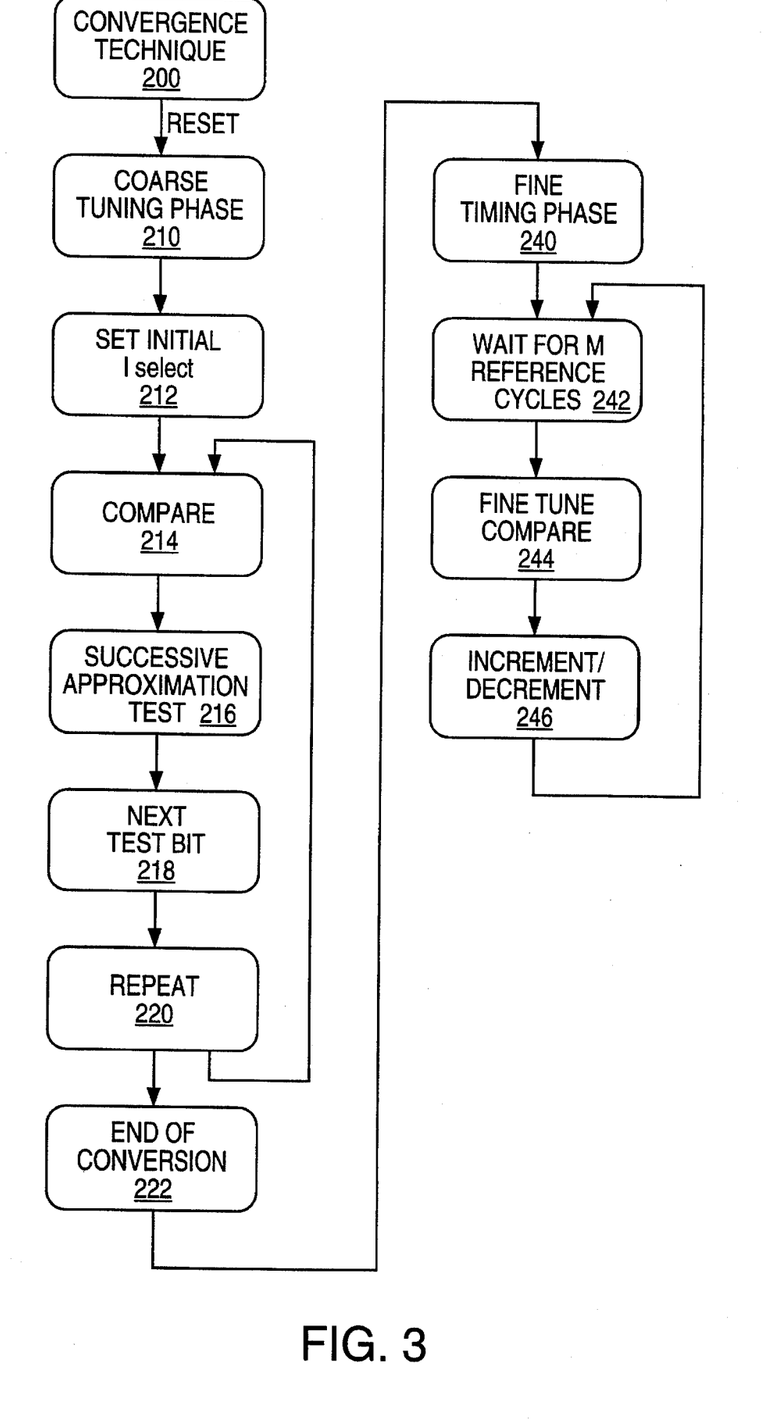
FIG. 3 is a flow chart illustrating a technique for calibrating the frequency multiplier shown in FIG. 2.

Referring to FIG. 3 in combination with FIG. 2, a convergence technique 200 for calibrating the frequency multiplier 100 includes a first coarse tuning phase 210 and a second fine tuning phase 240. The calibration technique is also called "frequency locking" of the multiplier. During the coarse tuning phase 210, a binary search method operates in a manner which is similar to a successive approximation digital to analog conversion to rapidly calibrate CCO frequency timing signals on the CCO frequency clock line 138. The coarse tuning phase 210 is typically activated only during a reset cycle of an integrated circuit chip. Accordingly, a reset signal of the integrated circuit chip begins the coarse tuning phase 210. In set initial $I_{select}$ step 212, a controller (the synchronous finite state machine (FSM) shown in FIG. 7, for example) sets the current select signal $I_{select}$ to a predetermined magnitude, for example S='10000000000000'. After a predetermined number of reference cycles (for example, cycle count control code M on the reference frequency clock line 132), the value in the counter 126 is compared to frequency multiplier count control code N by comparator 128 in compare step 214. The controller thereby determines the value of the highest order bit, specifically whether the next state is to be S='11XX . . . ' or S='01XX . . . ' in successive approximation test step 216. Next test bit step 218 sets the next state in accordance with the result of test step 216. Repeat control step 220 continues the process of steps 214, 216 and 218 for successively lower order bits of the current select signal $I_{select}$, for example from bit $S_{13}$ to bit $S_0$. At the end of the coarse tuning phase, in end-of-conversion step 222 the controller sets a "reset finished" signal which indicates to other circuits that the CCO frequency timing signals on the CCO frequency clock line 138 are to be used. This condition commences the fine tuning phase 240.

During the fine tuning phase 240, the frequency is incremented and decremented in small, constant-frequency increment steps to slowly calibrate CCO frequency timing signals on the CCO frequency clock line 138. In wait for M reference cycles step 242, the controller waits for a predetermined number of reference cycles (for example, cycle count control code M on the reference frequency clock line 132). After waiting in step 242, the value in the counter 126 is compared to frequency multiplier count control code N by comparator 128 in fine tuning compare step 244. In accordance with the result of fine tuning compare step 244, increment/decrement step 246 either increments, decrements or leaves the current select signal $I_{select}$ unchanged. During the fine tuning phase 240, but not the coarse tuning phase 210, control bits are applied to the current-controlled oscillator (CCO) 120 to improve frequency resolution in a manner discussed hereinafter.

Figure 4:
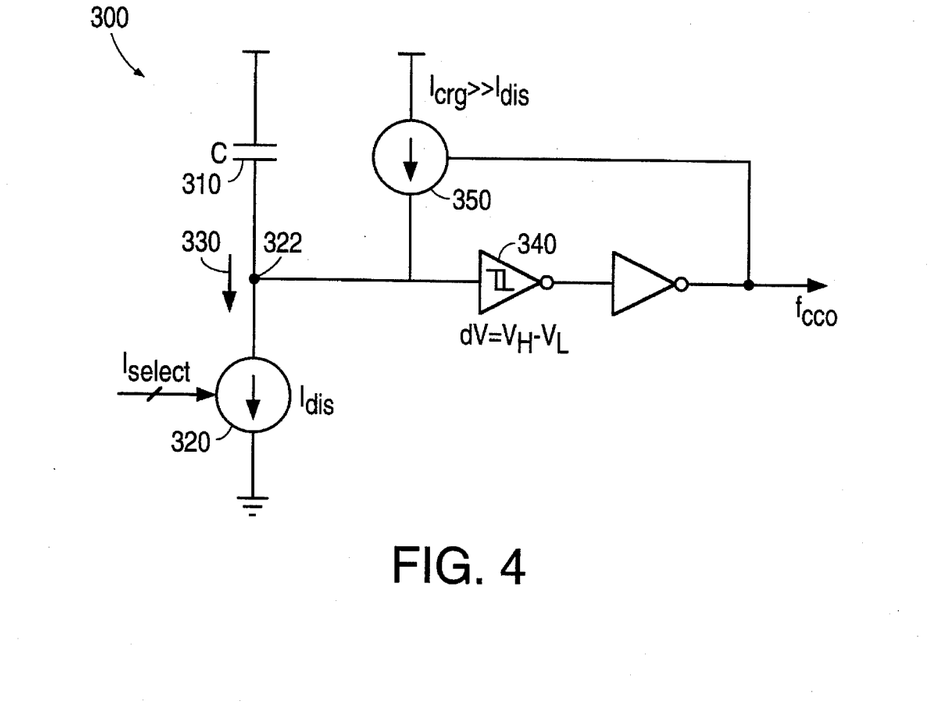
FIG. 4 is a schematic block diagram illustrating an embodiment of a current-controlled oscillator which is used in the frequency multiplier shown in FIG. 2.

Referring to FIG. 4, an embodiment of a current-controlled oscillator (CCO) 300 is shown which is used in the frequency multiplier 100. The CCO 300 includes a capacitor 310, a controlled-discharge current source 320 which is connected at node 322 to the capacitor 310 in a first current path 330, a Schmitt trigger 340 having an input terminal connected to the node 322, and a constant-charge current source 350 which is connected to the input terminal of the Schmitt trigger 340. The constant-charge current source 350 has a control input terminal which is connected to an output terminal of the Schmitt trigger 340 so that the constant-charge current source 350 is enabled by the Schmitt trigger 340. The Schmitt trigger 340 defines a voltage window dV of oscillation, the voltage difference between an upper threshold voltage $V_H$ of the Schmitt trigger 340 and a lower threshold voltage $V_L$ of the Schmitt trigger 340.

The capacitor 310 has a capacitance C. The capacitor 310 is discharged by a current sourced by the controlled-discharge current source 320. The magnitude of a discharge current $I_{dis}$ sourced by the controlled-discharge current source 320 is set in accordance with the digital $I_{select}$ signal determined by the CCO control circuit 120. The capacitor 310 is discharged until the voltage across the capacitor 310, at the node 322, reaches the lower threshold voltage $V_L$ of the Schmitt trigger 340. At the lower threshold voltage $V_L$, a voltage at an output terminal of the Schmitt trigger 340 changes state from a logic zero signal to a logic one signal and the constant-charge current source 350 is activated. The capacitor 310 is then charged by a constant charge current $I_{crg}$, which is sourced by the constant-charge current source 350, until the voltage at the node 322 reaches the upper threshold voltage $V_H$. At the high threshold voltage $V_H$, the voltage at an output terminal of the Schmitt trigger 340 changes state from a logic one to a logic zero, disabling the constant-charge current source 350. The oscillation cycle of the CCO 110 repeats accordingly.

The current-controlled oscillator (CCO) oscillation frequency $f_{CCO}$ and frequency resolution are determined substantially in accordance with the following equations (1) and (2):

$$Si_0 = \frac{CdV}{T_{CCO}} \qquad (1)$$

and $$(S+1)i_0 = \frac{Cdv}{(T_{CCO} - dT)} . \qquad (2)$$

where S is the digital $I_{select}$ signal code governing the discharge current magnitude, $i_0$ is a single discharge current step size—the least significant bit size of the $I_{select}$ signal, and dV is the Schmitt trigger voltage window ($V_H$–$V_L$). Furthermore, C is the capacitance of the capacitor 310 and $T_{CCO}$ is an oscillation time interval duration. The CCO oscillation frequency $f_{CCO}$ is equal to the reciprocal of the oscillation time interval duration $T_{CCO}$. The charge time of capacitor 310 is negligible compared to the discharge time.

Figure 5A:
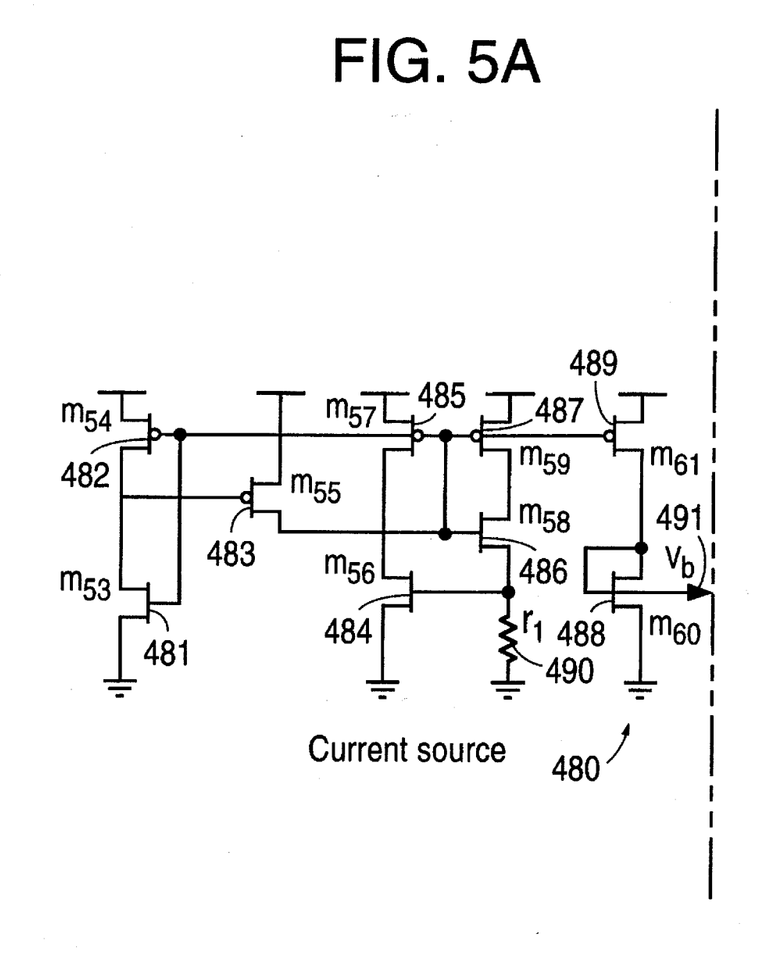
FIG. 5 is a schematic circuit diagram illustrating an embodiment of a current-controlled oscillator which is used in the frequency multiplier shown in FIG. 2.
Figure 5B:
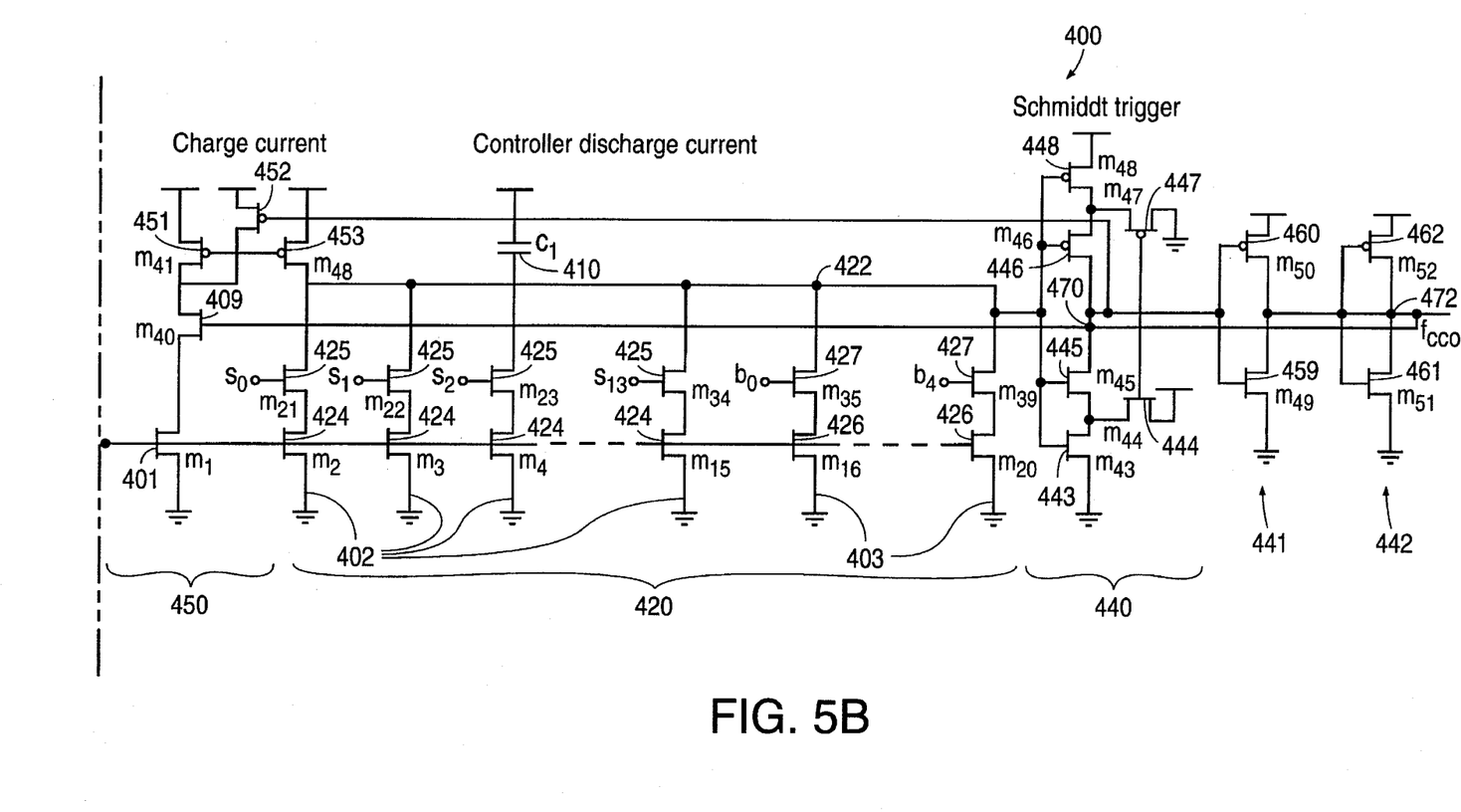

Referring to FIG. 5, a circuit-level diagram of an embodiment of a current-controlled oscillator (CCO) 400 is shown which is used in the frequency multiplier 100. The CCO 400 includes a capacitor 410, a controlled-discharge current source 420 which is connected at node 422 to the capacitor 410, a Schmitt trigger 440 having an input terminal connected to the node 422, and a constant-charge current source 450 which is connected to the input terminal of the Schmitt trigger 440 at the node 422. The CCO 400 also includes a $V_T$ referenced current source 480 which is connected to the controlled-discharge current source 420 and the constant-charge current source 450.

The $V_T$ referenced current source 480 generates a bias current which is referenced to a transistor threshold voltage. The bias current is mirrored to the controlled-discharge current source 420 and the constant-charge current source 450. The illustrative embodiment of the $V_T$ referenced current source 480 includes a resistor R 490, P-channel MOS transistors $M_{54}$ 482, $M_{55}$ 483, $M_{57}$ 485, $M_{59}$ 487, and $M_{61}$ 489 and N-channel MOS transistors $M_{53}$ 481, $M_{56}$ 484, $M_{58}$ 486, and $M_{60}$ 488. Transistor pairs including P-channel MOS transistor $M_{54}$ 482 and N-channel MOS transistor $M_{53}$ 481, P-channel MOS transistor $M_{57}$ 485 and N-channel MOS transistor $M_{56}$ 484, diode-connected P-channel MOS transistor $M_{59}$ 487 and N-channel MOS transistor $M_{58}$ 486, and P-channel MOS transistor $M_{61}$ 489 and diode-connected N-channel MOS transistor $M_{60}$ 488 have source-drain paths connected in series between a supply voltage terminal and a ground reference. Resistor R 490 is connected in series with P-channel MOS transistor $M_{59}$ 487 and N-channel MOS transistor $M_{58}$ 486. The gates of P-channel MOS transistors $M_{54}$ 482, $M_{57}$ 485, $M_{59}$ 487, and $M_{61}$ 489 are interconnected. P-channel MOS transistor $M_{55}$ 483 has a source terminal connected to the supply voltage terminal, a drain terminal connected to the gate terminal of N-channel MOS transistor $M_{58}$ 486 and a gate terminal connected to the drain terminals of P-channel MOS transistor $M_{54}$ 482 and N-channel MOS transistor $M_{53}$ 481. The gate terminals of P-channel MOS transistor $M_{54}$ 482 and N-channel MOS transistor $M_{53}$ 481 are interconnected. The gate terminal of N-channel MOS transistor $M_{56}$ 484 is connected between resistor R 490 and the source terminal of N-channel MOS transistor $M_{58}$ 486. The gate terminal of N-channel MOS transistor $M_{60}$ 488 is connected to a bias line 491, which is applied to controlled-discharge current source 420 and constant-charge current source 450. Usage of the $V_T$ referenced current source 480 is advantageous due to its low sensitivity to variations in supply voltage. Mirroring is achieved using N-channel MOS transistors, rather than P-channel transistors, to lessen the amount of circuit area utilized.

The constant-charge current source 450 charges the capacitor 410 under the control of Schmitt trigger 440. Constant-charge current source 450 includes P-channel MOS transistors $M_{41}$ 451, $M_{42}$ 452, and $M_{43}$ 453 and N-channel MOS transistors $M_1$ 401 and $M_{40}$ 409. P-channel MOS transistor $M_{41}$ 451 has a source terminal connected to the supply voltage terminal. N-channel MOS transistor $M_{40}$ 409 has a drain terminal connected to a drain terminal of P-channel MOS transistor $M_{41}$ 451. N-channel MOS transistor $M_1$ 401 has a drain terminal connected to a source terminal of N-channel MOS transistor $M_{40}$ 409, a source terminal connected to the ground reference and a gate terminal connected to the bias line 491. P-channel MOS transistor $M_{43}$ 453 has a source terminal connected to the supply voltage terminal and a gate terminal connected to the gate terminal of P-channel MOS transistor $M_{41}$ 451. P-channel MOS transistor $M_{42}$ 452 has a source terminal connected to the supply voltage terminal, a drain terminal connected to the drain terminals of P-channel MOS transistor $M_{41}$ 451 and N-channel MOS transistor $M_{40}$ 409, and a gate terminal connected to the Schmitt trigger 440.

Constant-charge current source 450 charges the capacitor 410 when enabled by a signal at the gate terminal of N-channel MOS transistor $M_{40}$ 409. P-channel MOS transistor $M_{42}$ 452 is included in the constant-charge current source 450 to more quickly terminate the charging current when the Schmitt trigger 440 disables the constant-charge current source 450. Furthermore, P-channel MOS transistor $M_{42}$ 452 also prevents a steady-state condition in which no oscillations occur when the discharge current is equal to the charge current. This steady-state condition is also prevented by utilizing a state condition signal from the Schmitt trigger 440 to control capacitor 410 charging since the capacitor 410 is accordingly charged only after a voltage at an output terminal of the Schmitt trigger 440 changes state from a logic zero signal to a logic one signal.

The controlled-discharge current source 420 includes a plurality of discharge control circuits 402, corresponding generally to the number of bits in the digital $I_{select}$ signal code. Each discharge control circuit 402 includes two N-channel MOS transistors connected in series between node 422 and the ground reference. One of the N-channel MOS transistors in a discharge control circuit 402 is a binary-weighted discharge current mirror transistor (for example, N-channel MOS transistors $M_2$, $M_3$, $M_4$, ..., $M_{14}$ and $M_{15}$ generally numbered 424). A second of the N-channel MOS transistors is an $I_{select}$ signal control switch transistor (for example, N-channel MOS transistors $M_{21}$, $M_{22}$, $M_{23}$, ..., $M_{33}$ and $M_{34}$ generally numbered 425). The node 422 is connected to capacitor 410 and to constant-charge current source 450.

Furthermore, a plurality of additional discharge control circuits 403 are supplied to improve the conversion from current to frequency by the CCO 400. Each discharge control circuit 403 includes two N-channel MOS transistors connected in series between node 422 and the ground reference. One of the N-channel MOS transistors in a discharge control circuit 403 is a binary-weighted discharge current mirror (for example, N-channel MOS transistors $M_{16}$, ..., and $M_{20}$ generally numbered 426). A second group of the N-channel MOS transistors are adjustable control transistors (for example, N-channel MOS transistors $M_{35}$, ..., and $M_{39}$ generally numbered 427).

Typically, depending on the process used to fabricate the CCO 400, current mirror accuracy may not extend to all bits of the $I_{select}$ signal. In one example, the current mirror accuracy extends to eight bits of a fourteen-bit digital $I_{select}$ signal code. Due to the high multiplication factor of the frequency multiplier 100 discussed herein, very large frequency errors result from relatively minor inaccuracies in conversion from the $I_{select}$ signal code to current. What results are large inaccuracies in a frequency-current characteristic relationship (f-I curve). Inaccuracies degrade the frequency resolution of a frequency multiplier circuit.

The following example illustrates the origin of large errors in the frequency-current characteristic relationship (f-I curve). Assuming that the $I_{select}$ signal changes from the binary designation of S='01110011111111' to the binary designation of S='01110100000000' so that a one-bit change in the $I_{select}$ should translate to a change of 1 µA in the CCO 400 controlled discharge current. In turn, the 1 µA change in controlled discharge current produces a 1000 Hz change in frequency at the output terminal of the CCO 400. If instead, due to inaccuracies relating to variability in fabrication processes, the single-bit change in the $I_{select}$ a signal causes a 10 µA change in current, rather than the appropriate 1 µA change, the single-bit change in $I_{select}$ signal causes a 10,000 Hz frequency change. This inaccuracy causes a missing segment, or "hole", in the $I_{select}$-frequency curve in which frequency operation from a frequency $F_o$ to frequency $F_o$+10,000 Hz does not reach all frequencies in the range from $F_o$ to $F_o$+9000 Hz.

The frequency multiplier circuit 100 solves the problem of conversion inaccuracies by adding a constant bias current to the discharge current, thereby shifting the operating range of the CCO 400 to the range set using a different $I_{select}$ signal value. In this example, the $I_{select}$ signal is shifted, for instance, from S='01110011111111' to S='01110011111000'. In this manner, the frequency multiplier 100 avoids operating in the inaccurate range of frequencies under conditions of simultaneous changing of several $I_{select}$ signal bits.

Inaccuracies in the f-I curve are addressed by controlling the bias current and the controlled discharge current of the CCO circuit 400 in parallel. One technique for controlling the bias current and controlled discharge current in parallel is to increment the bias discharging current by one step, having a magnitude of eight times $i_0$ the single discharge current step size, whenever more than 7 bits of the digital $I_{select}$ signal simultaneously change from a logic 1 value to a logic 0 value. For example, during fine tuning when the $I_{select}$ signal changes from the binary designation of S='01110011111111' to the binary designation of S='01110100000000', the bias discharging current is incremented by one step 8*$i_0$. This technique is advantageous because inaccuracies in the characteristic f-I curve of the CCO 400 are eliminated in a simple manner and the $I_{select}$ control word is restricted to be lower than the code value when multiple bits are changed simultaneously.

The plurality of additional discharge control circuits 403 are adjustable to prevent inaccuracies in the conversion from current to frequency by the CCO 400. Bias control bit signals are applied to the gate terminals of transistors in a binary-weighted discharge current mirror (for example, N-channel MOS transistors $M_{16}$, ..., and $M_{20}$ generally numbered 426) and switches 427 corresponding to the binary-weighted discharge current mirrors. In accordance with the convergence technique discussed with respect to FIG. 3, the bias control bit signals are set and the bias discharge control circuit 403 is activated during the fine tuning phase but not the coarse tuning phase. To further reduce inaccuracies in the f-I curve, overlapping weights, in which a unit change in the $I_{select}$ control word results in a change in frequency of less than a unit step, are employed for the current mirror transistors.

The Schmitt trigger 440 includes two P-channel MOS transistors $M_{48}$ 448 and $M_{46}$ 446 and two N-channel MOS transistors $M_{45}$ 445 and $M_{43}$ 443, all connected in series have a source-drain pathway between the power supply terminal and ground reference. The gate terminals of P-channel MOS transistors $M_{48}$ 448 and $M_{46}$ 446 and N-channel MOS transistors $M_{45}$ 445 and $M_{43}$ 443 are connected to node 422. A P-channel MOS transistor $M_{47}$ 447 has a source terminal connected to a node between the drain terminal of P-channel MOS transistor $M_{48}$ 448 and the source terminal of P-channel MOS transistor $M_{46}$ 446, and a drain terminal connected to the ground reference. An N-channel MOS transistor $M_{44}$ 444 has a source terminal connected to a node between the drain terminal of N-channel MOS transistor $M_{43}$ 443 and the source terminal of N-channel MOS transistor $M_{45}$ 445, a drain terminal connected to the supply voltage terminal, and a gate terminal connected to a gate terminal of P-channel MOS transistor $M_{47}$ 447. A trigger output signal at a node 470 between the drain terminals of P-channel MOS transistor $M_{46}$ 446 and N-channel MOS transistor $M_{45}$ 445 is connected to two inverters 441 and 442 to delay the activation of constant-charge current source 450, thereby avoiding the steady-state condition of equal charge and discharge currents. The first inverter 441 includes a P-channel MOS transistor $M_{50}$ 460 and an N-channel MOS transistor $M_{49}$ 459 having a source-drain pathway connected in series between the source voltage terminal and the ground reference. The gate terminals of P-channel MOS transistor $M_{50}$ 460 and an N-channel MOS transistor $M_{49}$ 459 are connected to the node 470. The second inverter 442 includes a P-channel MOS transistor $M_{52}$ 462 and an N-channel MOS transistor $M_{51}$ 461 having a source-drain pathway connected in series between the source voltage terminal and the ground reference. The gate terminals of P-channel MOS transistor $M_{52}$ 462 and an N-channel MOS transistor $M_{51}$ 461 are connected to a node between the drain terminals of P-channel MOS transistor $M_{50}$ 460 and N-channel MOS transistor $M_{49}$ 459. A node 472 between the drain terminals of P-channel MOS transistor $M_{52}$ 462 and N-channel MOS transistor $M_{51}$ 461 generates a delayed current-controlled oscillator (CCO) oscillation frequency $f_{CCO}$.

Figure 6A:
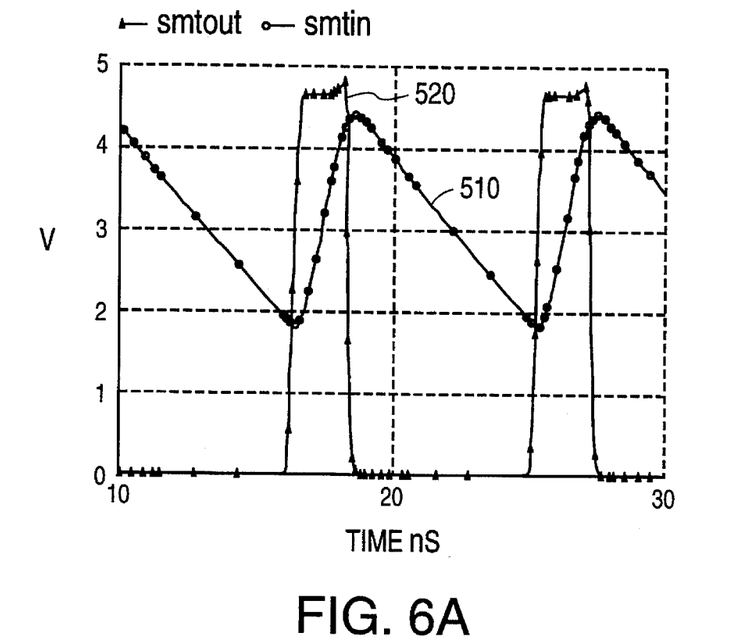
FIGS. 6(a) and 6(b) are graphs of simulation results of the operation of current-controlled oscillator shown in FIG. 5.
Figure 6B:
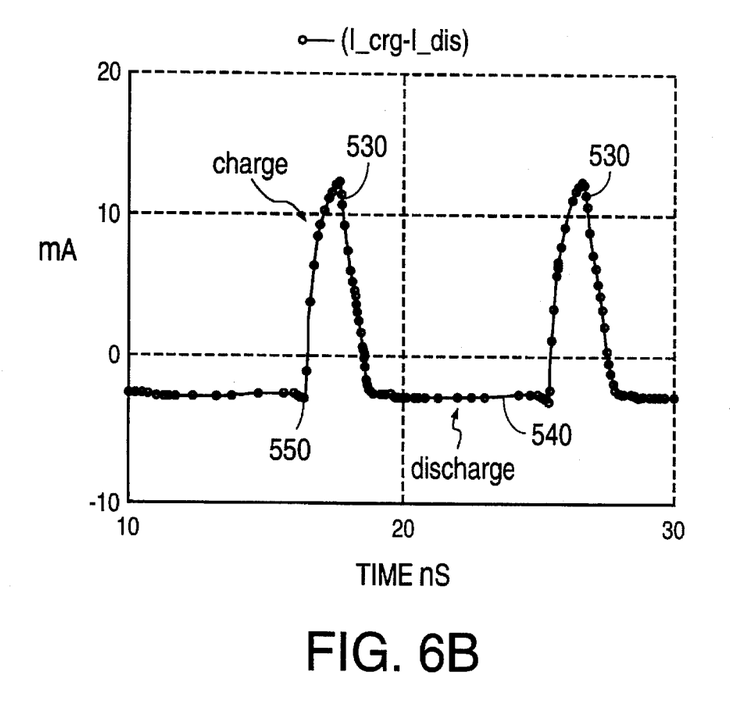

Referring to FIGS. 6(a) and 6(b) simulation results of the operation of the current-controlled oscillator (CCO) 400 are shown. In FIG. 6(a), simulated voltages at the input terminal 510 and the output terminal 520 of Schmitt trigger 440 are shown as a function of time. In FIG. 6(b), simulated charge currents 530 and discharge currents 540 at the output terminal of Schmitt trigger 440 are shown as a function of time. In this example, the $I_{select}$ control word signal has the value S='01000000000000' and the bias discharge current control word has the value B='00000'. Simulated conditions include typical process conditions and a 4.75 v supply voltage.

In FIG. 6(b), the deviation 550 from constant current during discharge, which occurs near the end of the discharge phase, is caused by the change of voltage drop of the switch transistor $M_{33}$ of transistors 425 (see FIG. 5) and the drain capacitance discharge current of binary-weighted discharge current mirror transistor $M_{14}$ of transistors 424, as the drain potential is reduced.

Figure 7:
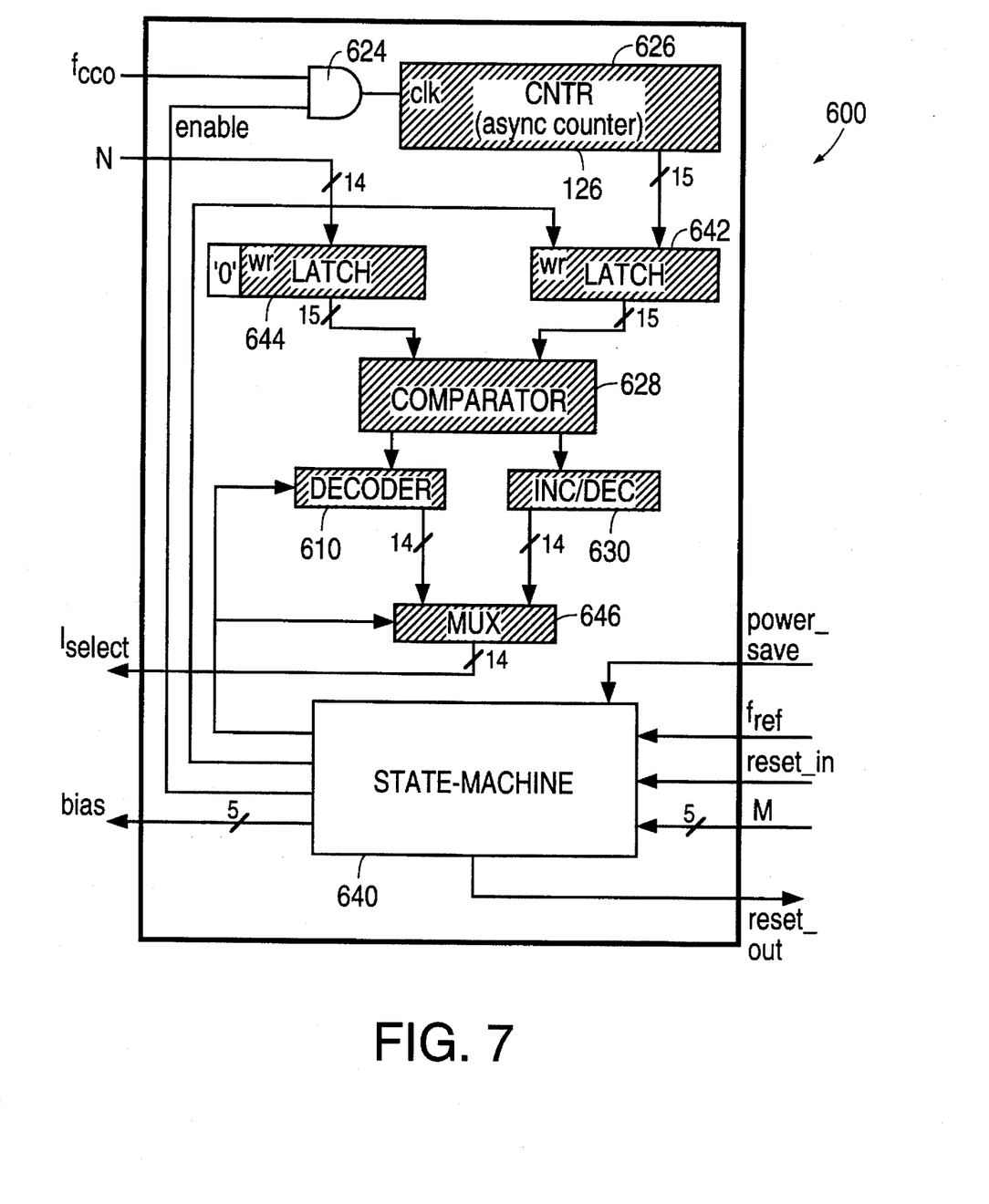
FIG. 7 is a schematic block diagram illustrating an embodiment of a current-controlled oscillator control circuit which is used in the frequency multiplier shown in FIG. 2.

Referring to FIG. 7, a schematic block diagram illustrates an embodiment of a current-controlled oscillator (CCO) control circuit 600. This embodiment of a CCO control circuit 600 includes an AND gate 624, an asynchronous counter 626, a comparator 628, a decoder 610 an increment/decrement circuit 630 and a synchronous finite state machine (FSM) circuit 640.

AND gate 624 receives a time frame signal from the FSM circuit 640 and a $f_{CCO}$ signal from a current-controlled oscillator and generates an output signal depicting the number of current controlled oscillator frequency cycles $f_{CCO}$ in a given time frame. The time frame is defined by the FSM circuit 640 as a number of cycles M of a reference clock signal $f_{REF}$. The asynchronous counter 626 receives the output signal from AND gate 624 and counts the number of $f_{CCO}$ cycles in the time frame. The asynchronous counter 626 applies the number of counts of $f_{CCO}$ cycles in a time frame to a latch 642 which latches the count and applies the count to the comparator 628. In the illustrative embodiment, the latch 642 is a 15-bit latch which applies a 15-bit digital signal to the comparator 628. A buffer 644 is connected to a plurality of N digital input lines supplying frequency multiplier count control code bits. The frequency multiplier count control code bits determine the frequency multiplication factor for generating a high-frequency timing signal from a low-frequency signal. The comparator 628, depicted as a 15-bit comparator, compares the number of enabled CCO frequency pulses with the frequency multiplier count control code and generates a binary logic signal which is applied on a line connected to the increment/decrement circuit 630.

The increment/decrement circuit 630 is a 14-bit circuit which increments and decrements the value of the current select signal $I_{select}$ during fine tuning. The increment/decrement circuit 630 also receives a 14-bit input signal from the decoder 610 which defines the value of the current select signal $I_{select}$ during coarse tuning. The decoder 610 decodes the current select signal $I_{select}$ from control signals received from the FSM circuit 640. The finite state machine circuit 640 thus controls the process of coarse tuning. A multiplexer 646 receives a version of the current select signal $I_{select}$ from the increment/decrement circuit 630 and from the decoder 610 and passes the appropriate current select signal $I_{select}$, depending on whether fine tuning or coarse tuning is selected.

The synchronous finite state machine (FSM) circuit 640 controls the functions of all circuits of the current-controlled oscillator (CCO) control circuit 600 according to the convergence technique discussed with respect to FIG. 3.

Figure 8:
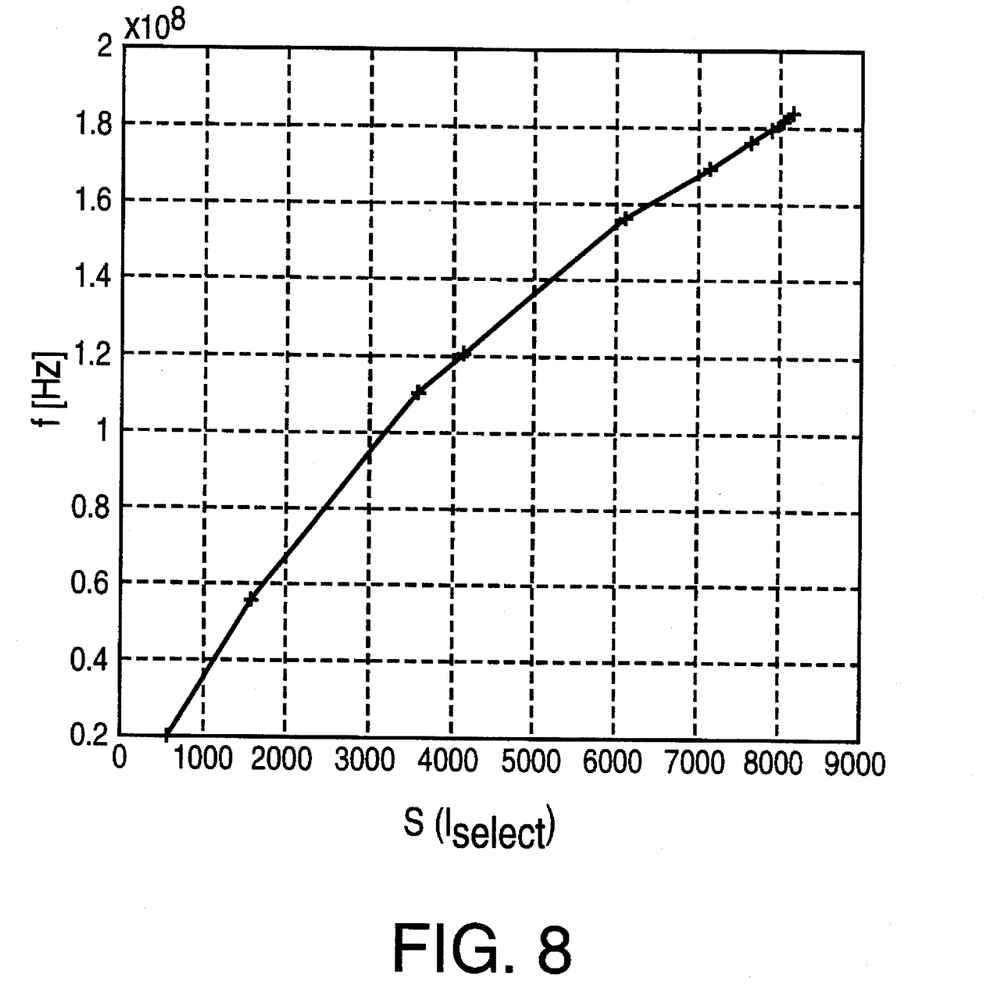
FIG. 8 is a graph illustrating a frequency-current relationship of the current-controlled oscillator shown in FIG. 5.

Referring to FIG. 8, a graph illustrating a frequency-current relationship of the current-controlled oscillator is shown. The operating point of a CCO is regulated either by changing the capacitance C of the CCO or by modifying the discharge LSB current value $i_0$.

The description of certain embodiments of this invention is intended to be illustrative and not limiting. Numerous other embodiments will be apparent to those skilled in the art, all of which are included within the broad scope of this invention. For example, the described current-controlled oscillator utilizes a controlled-discharge current source which is controlled by a programmed digital current select signal and a constant-charge current source which is not controlled by a programmed digital signal. In other embodiments, the charge-current is controlled by a programmed digital signal.

Similarly, the described coarse tuning control method utilizes a successive approximation technique for setting the digital current select signal. In other embodiments, other searching techniques, as are known in the art of computers, electronics and searching algorithms in general, may be used.

What is claimed is:

1. A frequency multiplier comprising:

a current-controlled oscillator generating a substantially constant charge current and a controlled discharge current and having a plurality of input lines connected to receive a digital current select signal controlling the controlled discharge current, and the current-controlled oscillator having an output terminal connected to carry a timing signal at a current-controlled oscillator frequency $f_{CCO}$ set in accordance with the current select signal, the current-controlled oscillator generating a controlled bias current for biasing a discharge current source and a charge current source, the controlled discharge current and the controlled bias current being controlled in parallel to substantially eliminate inaccuracies in a characteristic frequency-current curve of the current-controlled oscillator; and a control circuit having a first timing input terminal coupled to the current-controlled oscillator output terminal to receive the current-controlled oscillator frequency $f_{CCO}$, output lines coupled to the current-controlled oscillator digital current select input lines, a second timing input terminal connected to receive a timing signal at a reference frequency $f_{REF}$, and a plurality of input lines connected to receive a programmable frequency multiplication factor.

2. A frequency multiplier according to claim 1 wherein the control circuit further comprises:

an asynchronous counter for counting a cycle count of the current-controlled oscillator frequency $f_{CCO}$ timing signal;

a comparator coupled to the asynchronous counter for comparing the cycle count to an indication of the programmable frequency multiplication factor; and a current select signal update circuit coupled to the comparator for updating the current select signal as a function of the comparison.

3. A frequency multiplier according to claim 2 wherein the current select signal update circuit further comprises:

an increment/decrement circuit for incrementing and decrementing the current select signal as a function of the comparison.

4. A frequency multiplier according to claim 2 wherein the current select signal update circuit further comprises:

a controller for updating the current select signal using a successive approximation technique as a function of the comparison.

5. A frequency multiplier according to claim 1 wherein the control circuit further comprises:

an AND gate having a first input terminal coupled to receive the current-controlled oscillator frequency $f_{CCO}$, a second input terminal coupled to an enable line and an output terminal;

an asynchronous counter having an input terminal coupled to the output terminal of the AND gate and an plurality of binary output lines;

a comparator having a first plurality of binary input lines coupled to the binary output lines of the asynchronous counter, a second plurality of binary input lines coupled to receive an indication of the programmable frequency multiplication factor;

an increment/decrement circuit coupled to the comparator for incrementing and decrementing the current select signal as a function of the comparison;

a controller coupled to the comparator for updating the current select signal using a successive approximation technique as a function of the comparison.

6. A frequency multiplier according to claim 1 wherein the current-controlled oscillator further comprises:

a capacitor;

a controlled-discharge current source coupled to the capacitor, the controlled-discharge current source being controlled by the digital current select signal;

a constant-charge current source coupled to the capacitor and having a control input terminal for activating and deactivating the constant-charge current source; and a Schmitt trigger having an input terminal coupled to the capacitor and an output terminal connected to carry a timing signal at a current-controlled oscillator frequency $f_{CCO}$ the output terminal being connected to the constant-charge current source control input terminal.

7. A frequency multiplier according to claim 6 wherein the current-controlled oscillator further comprises:

an inverter coupled to the Schmitt trigger output terminal.

8. A frequency multiplier according to claim 6 wherein the controlled-discharge current source further comprises:

a plurality of discharge control circuits, the discharge control circuits including:

a binary-weighted discharge current mirror transistor having a gate terminal coupled to a bias current source and a source-drain pathway; and a current select signal control switch transistor having a gate terminal coupled to a bit of the digital current select signal and a source-drain pathway coupled in series with the source-drain pathway of the binary-weighted discharge current mirror transistor between the capacitor and a ground reference.

9. A frequency multiplier according to claim 8 wherein the controlled-discharge current source includes a discharge control circuit for each bit of the current select signal.

10. A frequency multiplier according to claim 9 wherein the controlled-discharge current source includes a plurality of discharge control circuits in excess of the discharge control circuits which correspond to the bits of the current select signal, the excess discharge control circuits for improving frequency resolution of the frequency multiplier.

11. A frequency multiplier according to claim 10 wherein the control circuit further comprises:

a controller coupled to the current select signal, the controller including:

means for fine tuning the current-controlled oscillator frequency by updating the current select signal in single unit steps;

means for detecting that a selected number of bits of the current select signal are changed simultaneously by the fine tuning means; and means operative when the detecting means detects that the preselected number of bits of the current select signal are changed for updating the current select signal a prescribed number of unit steps.

12. A frequency multiplier according to claim 6 wherein the controlled-discharge current source further comprises:

a plurality of discharge control circuits, the discharge control circuits including:

an overlapping-weighted discharge current mirror transistor having a gate terminal coupled to a bias current source and a source-drain pathway; and a current select signal control switch transistor having a gate terminal coupled to a bit of the digital current select signal and a source-drain pathway coupled in series with the source-drain pathway of the overlapping-weighted discharge current mirror transistor between the capacitor and a ground reference.

13. A frequency multiplier according to claim 12 wherein the controlled-discharge current source includes a discharge control circuit for each bit of the current select signal.

14. A frequency multiplier according to claim 13 wherein the controlled-discharge current source includes a plurality of discharge control circuits in excess of the discharge control circuits which correspond to the bits of the current select signal, the excess discharge control circuits for improving frequency resolution of the frequency multiplier.

15. A frequency multiplier according to claim 14 wherein the control circuit further comprises:

a controller coupled to the current select signal, the controller including:
means for fine tuning the current-controlled oscillator frequency by updating the current select signal in single unit steps;
means for detecting that a selected number of bits of the current select signal are changed simultaneously by the fine tuning means; and
means operative when the detecting means detects that the preselected number of bits of the current select signal are changed for updating the current select signal a prescribed number of unit steps.

16. A frequency multiplier according to claim 6 wherein the current-controlled oscillator further comprises:

a $V_T$ referenced current source coupled to the controlled-discharge current source and the constant-charge current source to supply the controlled bias current.

17. A current-controlled oscillator comprising:

a capacitor;

a discharge current source coupled to the capacitor, the discharge current source generating a controlled discharge current;

a charge current source coupled to the capacitor;

a bias current source coupled to bias the discharge current source and coupled to bias the charge current source, the bias current source generating a controlled bias current which is controlled in parallel with the controlled discharge current to substantially eliminate inaccuracies in a characteristic frequency-current curve of the current-controlled oscillator; and a Schmitt trigger having an input terminal coupled to the capacitor and an output terminal connected to carry a timing signal at a current-controlled oscillator frequency $f_{CCO}$.

18. A current-controlled oscillator according to claim 17 wherein:

the discharge current source is a controlled-discharge current source controlled by a digital current select signal;

the charge current source is a constant-charge current source having a control input terminal for activating and deactivating the constant-charge current source; and the Schmitt trigger output terminal is connected to the constant-charge current source control input terminal.

19. A current-controlled oscillator according to claim 18 further comprising:

an inverter coupled to the Schmitt trigger output terminal.

20. A current-controlled oscillator according to claim 18 further comprising:

a plurality of discharge control circuits, the discharge control circuits including:

a binary-weighted discharge current mirror transistor having a gate terminal coupled to the bias current source and having a source-drain pathway;

a current select signal control switch transistor having a gate terminal coupled to a bit of the digital current select signal and having a source-drain pathway coupled in series with the source-drain pathway of the binary-weighted discharge current mirror transistor between the capacitor and a ground reference.

21. A current-controlled oscillator according to claim 18 further comprising:

a plurality of discharge control circuits, the discharge control circuits including:

a overlapping-weighted discharge current mirror transistor having a gate terminal coupled to the bias current source and having a source-drain pathway;

a current select signal control switch transistor having a gate terminal coupled to a bit of the digital current select signal and having a source-drain pathway coupled in series with the source-drain pathway of the overlapping-weighted discharge current mirror transistor between the capacitor and a ground reference.

22. A current-controlled oscillator according to claim 18 wherein the controlled-discharge current source includes a discharge control circuit for each bit of the current select signal.

23. A current-controlled oscillator according to claim 22 wherein the controlled-discharge current source includes a plurality of discharge control circuits in excess of the discharge control circuits which correspond to the bits of the current select signal, the excess discharge control circuits for improving frequency resolution of the frequency multiplier.

24. A current-controlled oscillator according to claim 18 wherein:

the bias current source is a $V_T$ referenced current source.

25. A current-controlled oscillator according to claim 17 wherein:

the charge current source is a controlled-charge current source controlled by a digital current select signal.

26. A frequency multiplier comprising:

a current-controlled oscillator including:
a capacitor;
means coupled to the capacitor for discharging the capacitor by a current having a magnitude determined by a current select control signal, the discharging means generating a controlled discharge current;
means coupled to the capacitor for charging the capacitor by a constant current, the charging means having a switch for activating and deactivating the charging function;
means coupled to bias the discharging means and coupled to bias the charging means for generating a controlled bias current which is controlled in parallel with the controlled discharge current to substantially eliminate inaccuracies in a characteristic frequency-current curve of the current-controlled oscillator; and
a Schmitt trigger having an input terminal coupled to the capacitor and an output terminal coupled to a multiplied-frequency line, the output terminal also being connected to the charging means switch; and a controller coupled to the current-controlled oscillator including:
means coupled to a reference clock line for defining a time frame as a function of a programmable number of cycles of a reference clock timing signal on the reference clock line;

an asynchronous counter coupled to the defining means for counting a number of timing pulses on the multiplied-frequency line in the time frame;

a comparator coupled to the asynchronous counter and to a plurality of programmable multiplication factor lines for comparing the number of timing pulses in a time frame to the multiplication factor on the programmable multiplication factor lines; and means coupled to the comparator for updating the current select control signal as a function of the comparator result.

27. A frequency multiplier in accordance with claim 26 wherein:

the discharging means includes a plurality of current mirrors;

the charging means includes a plurality of current mirrors; and the means for generating a controlled bias current biases the current mirrors.

28. A frequency multiplier according to claim 26 wherein the updating means further comprises:

means for incrementing and decrementing the current select control signal as a function of the comparator result.

29. A frequency multiplier according to claim 26 wherein the updating means further comprises:

means for updating the current select control signal using a successive approximation technique as a function of the comparator result.

30. A method of multiplying the frequency of a timing signal comprising the steps of:

discharging a capacitor by a current mirrored through a plurality of discharge current mirrors and having a magnitude determined by a current select control signal;

charging the capacitor by a constant current mirrored through a plurality of charge current mirrors, the charging step being switchable for activating and deactivating the charging function;

generating a controlled bias current biasing the discharge current mirrors and the charge current mirrors, the controlled bias current being controlled in parallel with the controlled discharge current to substantially eliminate inaccuracies in a characteristic frequency-current curve;

generating a multiplied-frequency timing signal as a function of a voltage across the capacitor;

switching the capacitor charging step as a function of the multiplied-frequency timing signal;

defining a time frame as a function of a programmable number of cycles of a reference clock timing signal on a reference clock line;

counting a number of timing pulses of the multiplied-frequency timing signal;

comparing the number of timing pulses in a time frame to a programmable multiplication factor; and updating the current select control signal as a function of the comparison result.

31. A method according to claim 30 wherein the updating step comprises the step of:

incrementing and decrementing the current select control signal as a function of the comparison result.

32. A method according to claim 30 wherein the updating step comprises the step of:

updating the current select control signal using a successive approximation technique as a function of the comparison result.

* * * * *